(12) United States Patent
Lui et al.

(10) Patent No.: US 6,582,974 B2
(45) Date of Patent: Jun. 24, 2003

(54) METHOD FOR FORMING A DUAL DAMASCENE APERTURE WHILE EMPLOYING A PERIPHERALLY LOCALIZED INTERMEDIATE ETCH STOP LAYER

(75) Inventors: Lawrence MH Lui, Hsin-Chu (TW); Mei-Hui Sung, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/990,813

(22) Filed: Nov. 15, 2001

(65) Prior Publication Data

US 2003/0092260 A1 May 15, 2003

(51) Int. Cl.$^7$ ........................................... H01L 21/4763
(52) U.S. Cl. ............................ 438/6; 438/638; 438/740
(58) Field of Search ................................. 438/6–9, 638, 438/633, 626, 740, 970, FOR 126, FOR 101, FOR 141

(56) References Cited

U.S. PATENT DOCUMENTS

| | | | |
|---|---|---|---|
| 6,004,883 A | 12/1999 | Yu et al. | |
| 6,042,999 A | 3/2000 | Lin et al. | |
| 6,133,144 A | * 10/2000 | Tsai et al. | 257/758 |
| 6,225,211 B1 | * 5/2001 | Tsui | 438/624 |
| 6,498,092 B2 | * 12/2002 | Lee et al. | 438/634 |
| 2002/0037648 A1 | * 3/2002 | Nishizawa | 438/689 |
| 2002/0102854 A1 | * 8/2002 | Givens et al. | 438/692 |

* cited by examiner

Primary Examiner—George Fourson
Assistant Examiner—Suk-San Foong
(74) Attorney, Agent, or Firm—Tung & Associates

(57) ABSTRACT

Within a dual damascene method for forming a dual damascene aperture within a microelectronic fabrication there is employed an etch stop layer interposed between a first dielectric layer and second dielectric layer within a non active product region of a substrate, but not within an active product region of the substrate. Within the dual damascene method, an endpoint for forming a trench within a dual damascene aperture within the active product region is sensed by reaching the etch stop layer when forming a dummy trench within the non active product region.

15 Claims, 2 Drawing Sheets

METHOD FOR FORMING A DUAL DAMASCENE APERTURE WHILE EMPLOYING A PERIPHERALLY LOCALIZED INTERMEDIATE ETCH STOP LAYER

BACKGROUND OF THE INVENTION

1. Field of the Invention

The present invention relates generally to methods for forming dual damascene structures within microelectronic fabrications. More particularly, the present invention relates to methods for forming low dielectric constant dual damascene structures within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become increasingly common in the art of microelectronic fabrication to employ interposed between the patterns of patterned microelectronic conductor layers when fabricating microelectronic fabrications microelectronic dielectric layers formed of comparatively low dielectric constant dielectric materials. Such comparatively low dielectric constant dielectric materials generally have dielectric constants in a range of from about 3.5 to less than about 2.0. For comparison purposes, microelectronic dielectric layers formed within microelectronic fabrications from conventional silicon oxide dielectric materials, silicon nitride dielectric materials and silicon oxynitride dielectric materials typically have comparatively high dielectric constants in a range of from greater than about 4.0 to about 8.0. Similarly, such patterned microelectronic conductor layers having formed interposed between their patterns microelectronic dielectric layers formed of comparatively low dielectric constant dielectric materials are typically formed within microelectronic fabrications while employing damascene methods, including in particular dual damascene methods.

Microelectronic dielectric layers formed of comparatively low dielectric constant dielectric materials are desirable in the art of microelectronic fabrication formed interposed between the patterns of patterned microelectronic conductor layers within microelectronic fabrications insofar as such microelectronic dielectric layers provide microelectronic fabrications which may theoretically operate at higher microelectronic fabrication speeds, with attenuated patterned microelectronic conductor layer parasitic capacitance and attenuated patterned microelectronic conductor layer cross-talk.

Similarly, damascene methods are desirable in the art of microelectronic fabrication for forming patterned microelectronic conductor layers having formed interposed between their patterns microelectronic dielectric layers formed of comparatively low dielectric constant dielectric materials insofar as damascene methods are comparatively simple fabrication methods which may often be employed to fabricate microelectronic structures which are not otherwise practicably accessible in the art of microelectronic fabrication.

While damascene methods are thus desirable in the art of microelectronic fabrication for forming patterned microelectronic conductor layers having formed interposed between their patterns microelectronic dielectric layers formed of comparatively low dielectric constant dielectric materials, damascene methods are nonetheless not entirely without problems in the art of microelectronic fabrication for forming patterned microelectronic conductor layers having formed interposed between their patterns microelectronic dielectric layers formed of comparatively low dielectric constant dielectric materials. In that regard, while damascene methods are generally successful for forming patterned microelectronic conductor layers having formed interposed between their patterns microelectronic dielectric layers formed of comparatively low dielectric constant dielectric materials, damascene methods do not always uniformly provide such patterned microelectronic conductor layers within optimally low dielectric constant dielectric material layer constructions.

It is thus desirable in the art of microelectronic fabrication to provide damascene methods which may be employed in the art of microelectronic fabrication for uniformly providing patterned microelectronic conductor layers having formed interposed between their patterns microelectronic dielectric layers formed of comparatively and optimally low dielectric constant dielectric material layer constructions.

It is towards the foregoing object that the present invention is directed.

Various damascene methods have been disclosed in the art of microelectronic fabrication for forming within microelectronic fabrications damascene structures with desirable properties.

Included among the damascene methods, but not limited among the damascene methods, are damascene methods disclosed within: (1) Yu et al., in U.S. Pat. No. 6,004,883 (a dual damascene method for forming a contiguous patterned conductor interconnect and patterned conductor stud layer within a corresponding trench contiguous with a corresponding via formed through a dielectric layer within a microelectronic fabrication absent use of an extrinsic etch stop layer when forming the corresponding trench contiguous with the corresponding via, by employing when forming the dielectric layer a bilayer dielectric layer comprising: (1) a first dielectric material layer which is not susceptible to etching within an oxygen containing plasma, having formed thereupon; (2) a second dielectric material layer which is susceptible to etching within the oxygen containing plasma); and (2) Lin et al., in U.S. Pat. No. 6,042,999 (a dual damascene method for forming a contiguous patterned conductor interconnect and patterned conductor stud layer within a corresponding trench contiguous with a corresponding via through a dielectric layer within a microelectronic fabrication while avoiding substrate damage when forming the corresponding trench contiguous with the corresponding via, by employing a sacrificial material layer formed into the via when forming contiguous therewith the trench).

Desirable in the art of microelectronic fabrication are additional damascene methods which may be employed in the art of microelectronic fabrication for uniformly providing patterned microelectronic conductor layers having formed interposed between their patterns microelectronic dielectric layers formed of comparatively and optimally low dielectric constant dielectric material layer constructions.

It is towards the foregoing object that the present invention is directed.

SUMMARY OF THE INVENTION

A first object of the present invention is to provide a damascene method for forming within a microelectronic fabrication a patterned microelectronic conductor layer having formed interposed between its patterns a microelectronic dielectric layer formed of a comparatively low dielectric constant dielectric material.

A second object of the present invention is to provide a damascene method in accord with the first object of the present invention, wherein the patterned microelectronic conductor layer is uniformly formed within an optimally low dielectric constant dielectric material layer construction.

A third object of the present invention is to provide a damascene method in accord with the first object of the present invention and the second object of the present invention, wherein the damascene method is readily commercially implemented.

In accord with the objects of the present invention, there is provided by the present invention a method for forming a dual damascene aperture within a dielectric layer. To practice the method of the present invention, there is first provided a substrate having an active product region adjacent a non active product region. There is then formed over the substrate a first dielectric layer in turn having formed thereover a second dielectric layer. There is also formed over the substrate and interposed between the first dielectric layer and the second dielectric layer an etch stop layer in the non active product region, but not in the active product region. There is then formed through the second dielectric layer and the first dielectric layer in the active product region a dual damascene aperture comprising a trench contiguous with a via. Within the present invention, when forming the trench within the dual damascene aperture there is employed an etch method which forms a dummy trench within the non active product region. The dummy trench reaches the etch stop layer and the etch method senses the etch stop layer for end point detection when forming the trench within the dual damascene aperture within the active product region.

Within the present invention, a contiguous patterned conductor interconnect and patterned conductor stud layer may be formed into the dual damascene aperture, which comprises the trench contiguous with the via which in turn generally reaches a contact region, while employing a blanket conductor layer deposition and planarizing method, preferably a blanket conductor layer deposition and chemical mechanical polish (CMP) planarizing method.

The present invention provides a damascene method for forming within a microelectronic fabrication a patterned microelectronic conductor layer having formed interposed between its patterns a microelectronic dielectric layer formed of a comparatively low dielectric constant dielectric material, wherein the patterned microelectronic conductor layer is uniformly formed within an optimally low dielectric constant dielectric material layer construction.

The present invention realizes the foregoing object by providing in a first instance a substrate having an active product region adjacent a non active product region. Within the present invention, the substrate has formed thereover a first dielectric layer in turn having formed thereover a second dielectric layer, wherein there is also formed interposed between the first dielectric layer and the second dielectric layer an etch stop layer in the non active product region, but not in the active product region. Thus, when there is formed through the second dielectric layer and the first dielectric layer in the active product region a dual damascene aperture comprising a trench contiguous with a via, there may be employed an etch method which forms a dummy trench within the non active product region, such that: (1) the dummy trench reaches the etch stop layer; and (2) the etch method senses the etch stop layer, for end point detection when forming the trench within the dual damascene aperture within the active product region. Since within the present invention there is not employed within the active product region an etch stop layer, a microelectronic fabrication fabricated in accord with the present invention may be fabricated with an optimally low dielectric constant dielectric material layer construction within an active product region. Similarly, since when forming the trench within the active product region there is employed a dummy trench which reaches the etch stop layer and provides for sensation of the etch stop layer within the non active product region, a patterned conductor layer formed within the dual damascene aperture is formed with enhanced uniformity insofar as there may be avoided an otherwise non-uniform timed etch for forming the trench within the dual damascene aperture within the active product region.

The damascene method in accord with the present invention is readily commercially implemented.

As will be illustrated in greater detail within the context of the Description of the Preferred Embodiments, as set forth below, the damascene method of the present invention employs methods and materials as are otherwise generally known in the art of microelectronic fabrication, but employed within the context of specific process limitations and specific materials limitations to provide the damascene method of the present invention. Since it is thus at least in part a series of specific process limitations and specific materials limitations which provides at least in part the present invention, rather than the existence of methods and materials which provides the present invention, the damascene method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
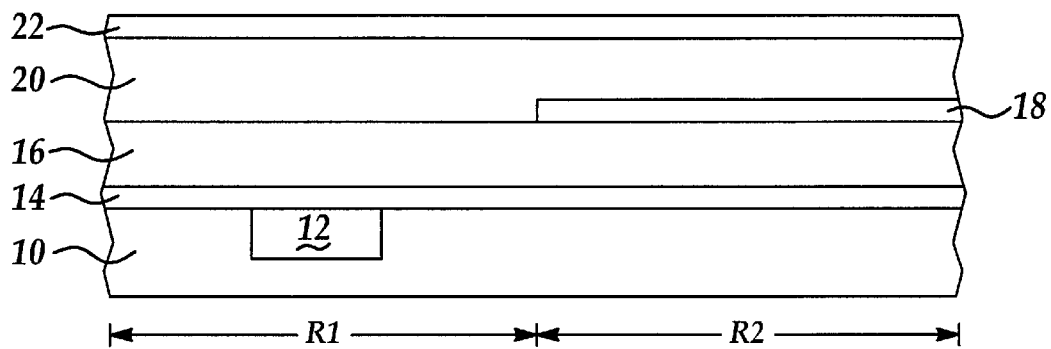
FIG. 1, FIG. 2, FIG. 3, FIG. 4, FIG. 5 and FIG. 6 show a series of schematic cross-sectional diagrams illustrating the results of progressive stages of forming, in accord with the preferred embodiments of the present invention, a patterned conductor layer within a microelectronic fabrication while employing a damascene method.

The present invention provides a damascene method for forming within a microelectronic fabrication a patterned microelectronic conductor layer having formed interposed between its patterns a microelectronic dielectric layer formed of a comparatively low dielectric constant dielectric material, wherein the patterned microelectronic conductor layer is uniformly formed within an optimally low dielectric constant dielectric material layer construction.

The present invention realizes the foregoing object by providing in a first instance a substrate having an active product region adjacent a non active product region. Within the present invention, the substrate has formed thereover a first dielectric layer in turn having formed thereover a second dielectric layer, wherein there is also formed interposed between the first dielectric layer and the second dielectric layer an etch stop layer in the non active product region, but not in the active product region. Thus, when there is formed through the second dielectric layer and the first dielectric layer in the active product region a dual damascene aperture comprising a trench contiguous with a via, there may be employed an etch method which forms a dummy trench within the non active product region, such that: (1) the dummy trench reaches the etch stop layer; and (2) the etch method senses the etch stop layer, for end point detection when forming the trench within the dual damascene aperture within the active product region. Since within the present invention there is not employed within the active product region an etch stop layer, a microelectronic fabrication fabricated in accord with the present invention may be fabricated with an optimally low dielectric constant dielectric material layer construction. Similarly, since when forming the trench within the active product region there is employed a dummy trench which reaches the etch stop layer and provides for sensation of the etch stop layer within the non active product region, a patterned conductor layer formed within the dual damascene aperture is formed with enhanced uniformity insofar as there may be avoided an otherwise non-uniform timed etch for forming the trench within the dual damascene aperture within the active product region.

More particularly, the preferred embodiments of the present invention provide value within the context of forming, while employing a dual damascene method, and within a semiconductor integrated circuit microelectronic fabrication, a patterned microelectronic conductor layer having formed interposed between its patterns a microelectronic dielectric layer formed of a comparatively low dielectric constant dielectric material. However, the present invention may nonetheless be employed for forming analogous patterned conductor layers within microelectronic fabrications selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 6, there is shown a series of schematic cross-sectional diagrams illustrating the results of progressive stages of forming, in accord with a pair of preferred embodiments of the present invention, a patterned microelectronic conductor layer within a microelectronic fabrication while employing a dual damascene method.

Shown in FIG. 1 is a schematic cross-sectional diagram of the microelectronic fabrication at an early stage in its fabrication in accord with the preferred embodiments of the present invention.

Shown in FIG. 1, in a first instance, is a substrate 10 having formed therein a contact region 12.

Within the preferred embodiments of the present invention with respect to the substrate 10, the substrate 10 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of a substrate alone as employed within the microelectronic fabrication, or in an alternative, the substrate 10 may comprise a substrate as employed within the microelectronic fabrication, wherein the substrate has formed thereupon and/or thereover any of several additional microelectronic layers as are conventionally employed within the microelectronic fabrication within which is employed the substrate. Similarly with the substrate alone as employed within the microelectronic fabrication, such additional microelectronic layers may be formed from microelectronic materials selected from the group including but not limited to microelectronic conductor materials, microelectronic semiconductor materials and microelectronic dielectric materials.

In addition, and although also not specifically illustrated within the schematic cross-sectional diagram of FIG. 1, the substrate 10, typically and preferably, but not exclusively, when the substrate 10 consists of or comprises a semiconductor substrate as employed within a semiconductor integrated circuit microelectronic fabrication, has formed therein and/or thereupon microelectronic devices as are similarly also conventional within the microelectronic fabrication within which is employed the substrate 10. Such microelectronic devices may be selected from the group including but not limited to resistors, transistors, diodes and capacitors.

Within the preferred embodiment of the present invention with respect to the contact region 12, the contact region 12 is typically and preferably either: (1) a semiconductor contact region, particularly under circumstances where the substrate 10 consists of or comprises a semiconductor substrate as employed within a semiconductor integrated circuit microelectronic fabrication; or (2) a conductor contact region, under circumstances where the substrate 10 is employed within any of the several foregoing microelectronic fabrications.

As is also illustrated within the schematic cross-sectional diagram of FIG. 1 with respect to the substrate 10, the substrate comprises a minimum of two regions. A first of the minimum of two regions is an active product region R1 having contained therein the contact region 12. The second of the minimum of two regions is a non active product region R2 adjacent the active product region R1. Within the present invention and the preferred embodiment of the present invention, the non active product region R2 may comprise, but is not limited to: (1) a field region within which there is formed within the substrate 10 an isolation region; (2) a kerf region of the substrate 10; and (3) a peripheral region of the substrate 10, over which there may be formed comparatively less dense (i.e., widely separated) interconnections, but no active or passive devices.

Shown also within the schematic cross-sectional diagram of FIG. 1, and formed upon the substrate 10 having formed therein the contact region 12, is a series of layers comprising: (1) an optional blanket first etch stop/liner layer 14 formed upon the substrate 10 having formed therein the contact region 12; (2) a blanket first dielectric layer 16 formed upon the blanket first etch stop/liner layer 14; (3) a patterned second etch stop layer 18 formed upon the blanket first dielectric layer 16 within the non active product region R2 of the substrate 10, but not within the active product region R1 of the substrate; (4) a blanket second dielectric layer 20 formed upon exposed portions of the blanket first dielectric layer 16 and the patterned second etch stop layer 18; and (5) an optional blanket third etch stop/planarizing stop layer 22 formed upon the blanket second dielectric layer 20.

Within the preferred embodiment of the present invention with respect to the optional blanket first etch stop/liner layer 14, the patterned second etch stop layer 18 and the optional blanket third etch stop/planarizing stop layer 22, each of the foregoing layers may be formed employing methods and materials as are conventional in the art of microelectronic fabrication. Such materials may include, but are not limited to, dielectric etch stop materials selected from the group consisting of silicon oxide etch stop materials, silicon nitride etch stop materials, silicon oxynitride etch stop materials and silicon carbide etch stop materials deposited employing methods including but to limited to chemical vapor deposition (CVD) methods, plasma enhanced chemical vapor deposition (PECVD) methods and physical vapor deposition (PVD) sputtering methods. Similarly, the patterned second etch stop layer 18 may alternatively be formed of a conductor etch stop material. From a practical perspective, and under circumstances where the contact region 12 is formed of a copper containing conductor material, a preferred etch stop material for at least the blanket first etch stop/liner layer 14 is either a silicon nitride etch stop material or (more preferably due to dielectric constant considerations) a silicon carbide etch stop material, insofar as copper containing conductor materials are understood in the art to be susceptible to interdiffusion with silicon oxide etch stop materials. Similarly, and also for practical reasons as disclosed below, it is generally desirable for the patterned second etch stop layer 18 to be formed of a different etch stop material in comparison with the blanket first etch stop/liner layer 14 and the blanket third etch stop/planarizing stop layer 22, if the latter two layers are present.

Typically and preferably, the blanket first etch stop/liner layer 14 is formed to a thickness of from about 500 to about 1000 angstroms, the patterned second etch stop layer 18 is formed to a thickness of from about 500 to about 1000 angstroms and the blanket third etch stop/planarizing stop layer 22 is formed to a thickness of from about 500 to about 1000 angstroms. Similarly, while the blanket first etch stop/liner layer 14 and the blanket third etch stop/planarizing stop layer 22 are optional within the present invention, they are typically preferred within the present invention, due to their liner layer characteristics and planarizing stop layer characteristics.

Within the preferred embodiment of the present invention with respect to the blanket first dielectric layer 16 and the blanket second dielectric layer 20, the blanket first dielectric layer 16 and the blanket second dielectric layer 20 may be formed from any of several comparatively low dielectric constant dielectric materials as are conventional or unconventional in the art of microelectronic fabrication. Such comparatively low dielectric constant dielectric materials may include but are not limited to spin-on-glass (SOG) dielectric materials, spin-on-polymer (SOP) dielectric materials, nanoporous dielectric materials, amorphous carbon dielectric materials and fluorosilicate glass (FSG) dielectric materials. However, the present invention provides particular value under circumstances where the blanket first dielectric layer 16 and the blanket second dielectric layer 20 are formed of a porous dielectric material, and in particular a nanoporous silicon oxide based dielectric material, generally having a particularly low dielectric constant in a range of from about 2.0 to about 2.5. Typically and preferably, each of the blanket first dielectric layer 16 and the blanket second dielectric layer 20 is formed to a thickness of from about 3000 to about 6000 angstroms and each of the blanket first dielectric layer 16 and the blanket second dielectric layer 20 is formed of the same dielectric material, although such limitation is not required within the present invention and the preferred embodiments of the present invention.

Figure 2:
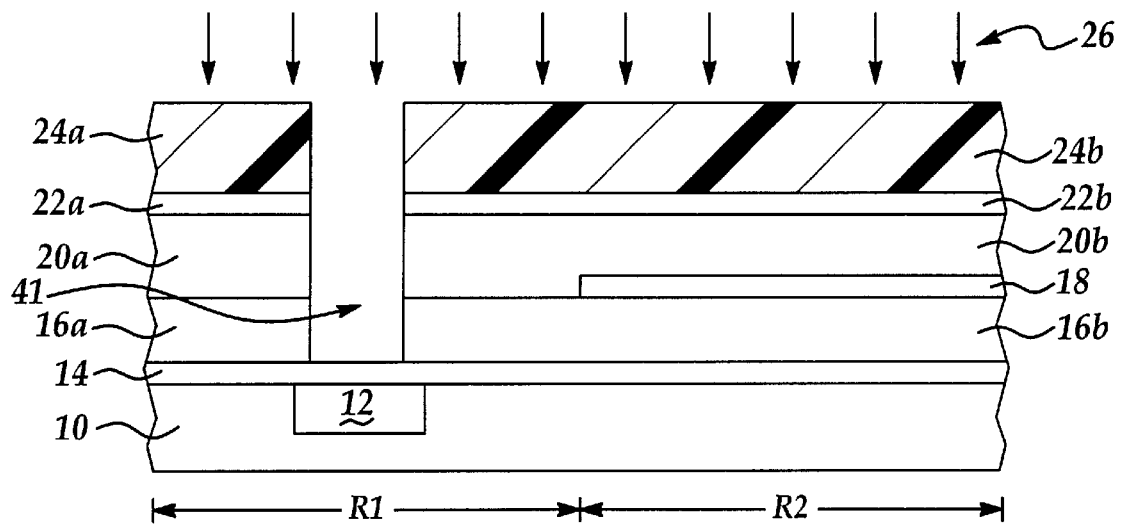

Referring now to FIG. 2, there is shown, in accord with a first preferred embodiment of the present invention, a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein, in a first instance, there is formed upon the blanket third etch stop/planarizing stop layer 22 a pair of patterned photoresist layers 24a and 24b which defines the location of a via to be formed through the blanket third etch stop/planarizing stop layer 22, the second dielectric layer 20, the first dielectric layer 16 and the blanket first etch stop/liner layer 14 to reach the contact region 12. The pair of patterned first photoresist layers 24a and 24b may be formed of photoresist materials as are conventional in the art of microelectronic fabrication, including but not limited to positive photoresist materials and negative photoresist materials. Typically and preferably, each of the pair of patterned photoresist layers 24a and 24b is formed to a thickness of from about 4000 to about 8000 angstroms.

Also shown in the schematic cross-sectional diagram of FIG. 2 is the results of etching, while employing the pair of patterned first photoresist layers 24a and 24b as a first etch mask layer, and in conjunction with a first etching plasma 26, the blanket third etch stop/planarizing stop layer 22, the blanket second dielectric layer 20 and the blanket first dielectric layer 16 to form a corresponding pair of patterned third etch stop/planarizing stop layers 22a and 22b, a corresponding pair of patterned second dielectric layers 20a and 20b and a corresponding pair of patterned first dielectric layers 16a and 16b which form a first via 41 centered over the contact region 12.

Within the preferred embodiment of the present invention, the first etching plasma 26 employs an etchant gas composition, or a series of etchant gas compositions, as are conventional or unconventional in the art of microelectronic fabrication, and appropriate for etching the materials from which are formed the blanket third etch stop/planarizing stop layer 22, the blanket second dielectric layer 20 and the blanket first dielectric layer 16.

Figure 3:
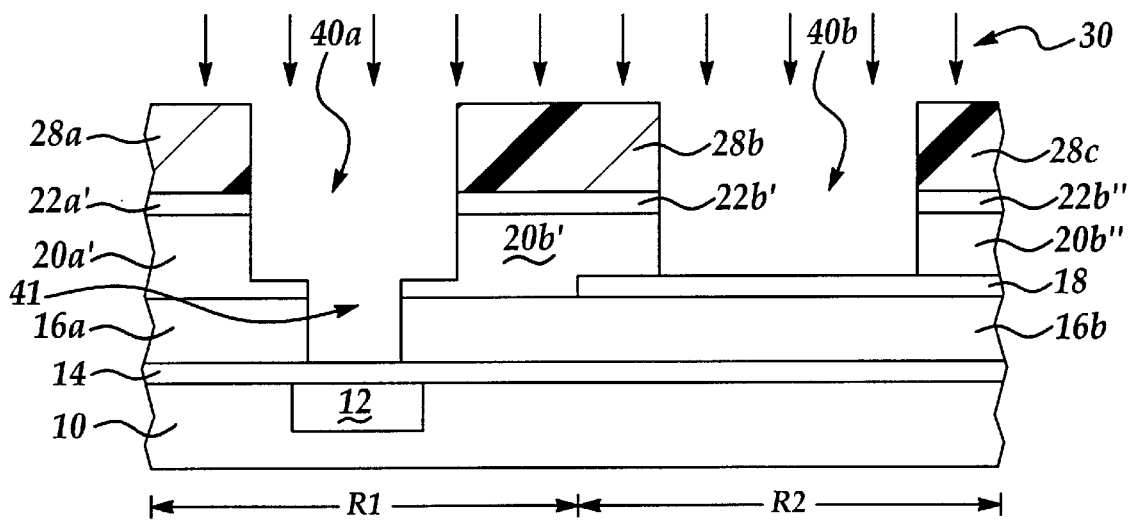

Referring now to FIG. 3, there is shown a schematic cross-sectional diagram illustrating the results of further processing the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein, in a first instance, the pair of patterned first photoresist layers 24a and 24b has been stripped from the microelectronic fabrication.

The pair of patterned first photoresist layers 24a and 24b may be stripped from the microelectronic fabrication whose schematic cross-sectional diagram of FIG. 2 to provide in part the microelectronic fabrication whose schematic cross-sectional diagram is illustrated in FIG. 3 while employing photoresist stripping methods and materials as are conventional in the art of microelectronic fabrication.

Shown also within the schematic cross-sectional diagram of FIG. 3 is a series of patterned second photoresist layers 28a, 28b and 28c, which is formed upon the pair of patterned third etch stop/planarizing stop layers 22a and 22b, where: (1) the pair of patterned second photoresist layers 28a and 28b defines the location of a trench to be formed contiguous with a via which accesses the contact region 12 within the active product region R1 of the substrate 10; and (2) the pair of patterned second photoresist layers 28b and 28c defines the location of a dummy trench to be formed accessing the patterned second etch stop layer 18 within the non active product region R2 of the substrate 10.

Finally, there is also shown within the schematic cross-sectional diagram of FIG. 3 the results of forming: (1) within the active product region R1 of the substrate 10 a trench 40a (defined by a pair of twice patterned third etch stop/planarizing stop layers 22a' and 22b' and in part by a pair of twice patterned second dielectric layers 20a' and 20b') contiguous with a second via 42 derived from the first via 41 intended to reach the contact region 12; and (2) within the non active product region R2 of the substrate 10 a dummy trench 40b (defined by a pair of twice patterned third etch stop/planarizing stop layers 22b' and 22b" and a pair of twice patterned second dielectric layers 20b' and 20b") accessing the patterned second etch stop layer 18. Within the first preferred embodiment of the present invention, the trench 40a and the dummy trench 40b are formed while employing a second etching plasma 30, in conjunction with the series of patterned second photoresist layers 28a, 28b and 28c as a second etch mask layer.

Within the preferred embodiment of the present invention, the second etching plasma 30 may employ methods and materials analogous or equivalent to the methods and materials employed within the first etching plasma 26. Similarly, within the present invention, the second etching plasma 28 when forming the dummy trench 40b and reaching the patterned second etch stop layer 18 senses the patterned second etch stop layer 18 for end point detection when forming the trench 40a contiguous with the via 42 within the active product region R1 of the substrate 10.

Figure 4:
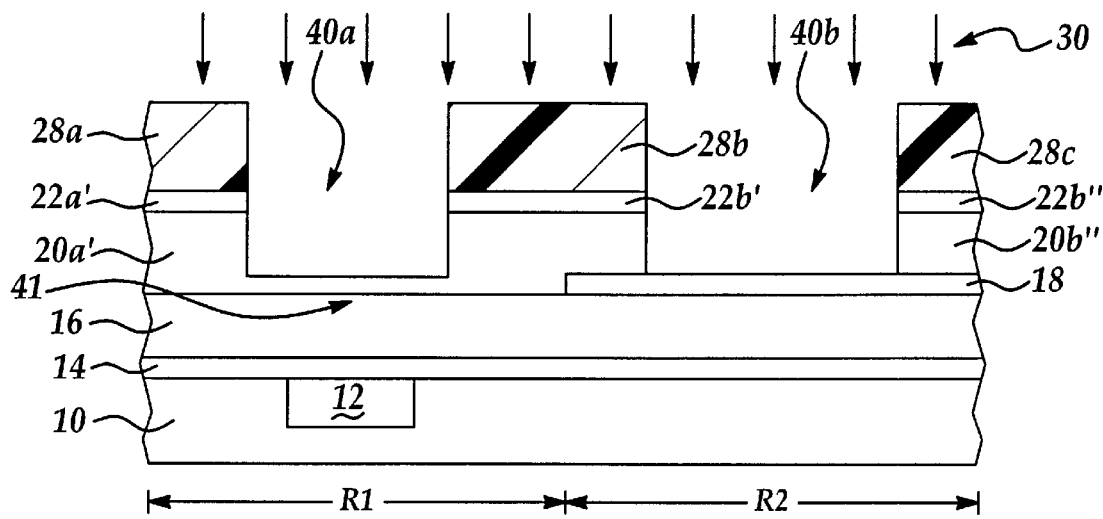
Figure 5:
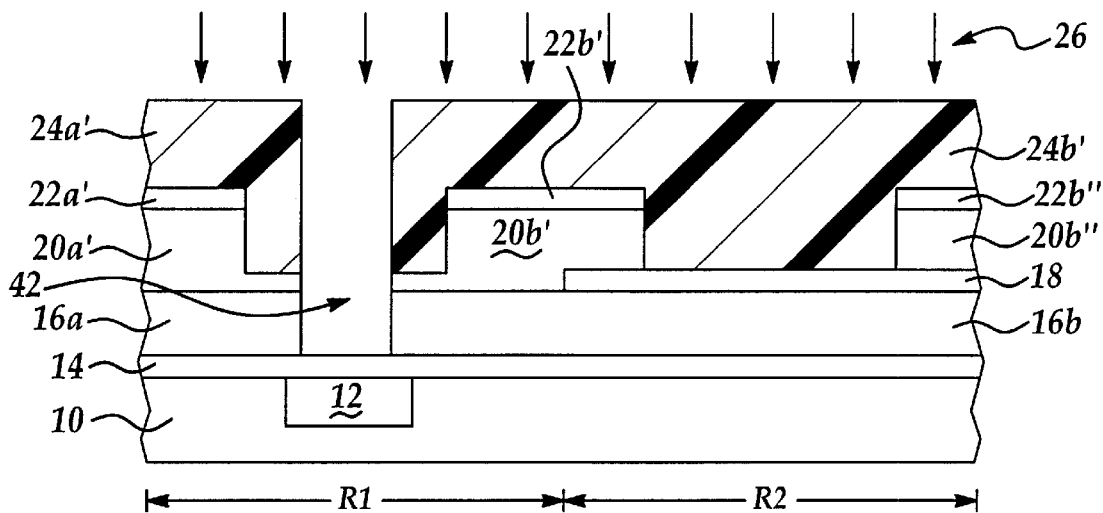

Referring now to FIG. 4 and FIG. 5, there is shown a pair of schematic cross-sectional diagrams illustrating the results of an alternative processing of the microelectronic fabrication whose schematic cross-sectional diagram is illustrated in FIG. 1, to provide a microelectronic fabrication functionally equivalent and generally identical to the microelectronic fabrication whose schematic cross-sectional diagram is illustrated in FIG. 3. The schematic cross-sectional diagrams of FIG. 4 and FIG. 5 illustrate a second preferred embodiment of the present invention.

In that regard, while within the first preferred embodiment of the present invention the schematic cross-sectional diagrams of FIG. 2 and FIG. 3 illustrate a process flow which first provides a via etch and second provides a trench etch to form in part a dual damascene aperture which comprises a trench contiguous with a via, the schematic cross-sectional diagrams of FIG. 4 and FIG. 5 alternatively illustrate first a trench etch and second a via etch to form in part the dual damascene aperture.

Thus, within the schematic cross-sectional diagram of FIG. 4, there is first illustrated the series of patterned second photoresist layers 28a, 28b and 28c formed upon the blanket third etch stop/planarizing stop layer 22 as illustrated within the schematic cross-sectional diagram of FIG. 1. Similarly, there is also illustrated within the schematic cross-sectional diagram of FIG. 4 the results of forming, while employing the second etching plasma 30, in conjunction with the series of patterned second photoresist layers 28a, 28b and 28c as a first etch mask layer: (1) a series of patterned third etch stop/planarizing stop layers which are equivalent or identical to the series of twice patterned third etch stop/planarizing stop layers 22a', 22b'. and 22c' as illustrated within the schematic cross-sectional diagram of FIG. 3, along with; (2) a pair of patterned second dielectric layers 20c and 20b" which define the trench 40a and the dummy trench 40botherwise identical or equivalent to the trench 40a and dummy trench 40b as illustrated within the schematic cross-sectional diagram of FIG. 3. Similarly, and in accord with the first preferred embodiment of the present invention, when reaching and sensing within the second preferred embodiment of the present invention the patterned second etch stop layer 18 when forming the dummy trench 40b there is provided an endpoint detection for forming the trench 40a within the active product region R1 of the substrate 10.

Referring now to FIG. 5, there is shown a schematic cross sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein, in a first instance, the series of patterned second photoresist layers 28a, 28b and 28c has been stripped from the microelectronic fabrication and replaced with a pair of alternative patterned first photoresist layers 24a' and 24b'. The pair of alternative patterned first photoresist layers 24a' and 24b' is generally functionally equivalent to the pair of patterned first photoresist layers 24a and 24b as illustrated within the schematic cross-sectional diagram of FIG. 2 (i.e., they both define the location of a via to be formed contiguous with a trench and ultimately reaching the contact region).

Finally, there is shown within the schematic cross-sectional diagram of FIG. 5 the results of forming through the patterned second dielectric layer 20c and the patterned first dielectric layer 16 the second via 42 contiguous with the trench 40a (as illustrated in FIG. 4) to ultimately intended to access the contact region 12 within the active product region R1 of the substrate 10. Within the second preferred embodiment of the present invention, the second via 42 may be formed while employing the first etching plasma 26, in conjunction with the pair of alternative patterned first photoresist layers 24a' and 24b' as a second etch mask layer.

Figure 6:
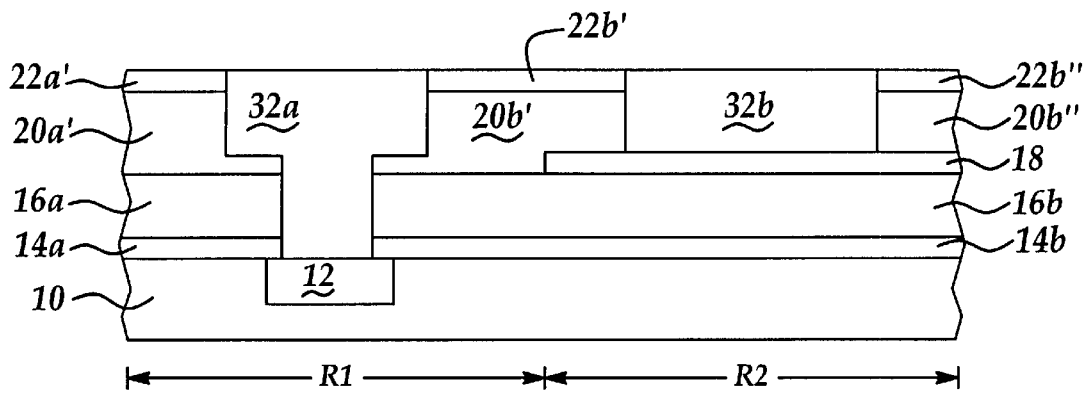

Referring now to FIG. 6, there is shown a schematic cross-sectional diagram illustrating the results of further processing of the microelectronic fabrication whose schematic cross-sectional diagram is illustrated in FIG. 3 or whose schematic cross-sectional diagram is illustrated in FIG. 5.

Shown in FIG. 6 is a schematic cross-sectional diagram of a microelectronic fabrication otherwise equivalent to the microelectronic fabrication whose schematic cross-sectional diagram is illustrated in FIG. 3 or whose schematic cross-sectional diagram is illustrated in FIG. 5, but wherein, in a first instance: (1) the blanket first etch stop liner layer 14 has been patterned to form a pair of patterned first etch stop/liner layers 14a and 14b exposing the contact region 12 with the active product region R1 of the substrate 10; and (2) the pair of patterned second photoresist layers 28a, 28b and 28c, or the pair of alternative patterned first photoresist layer 24a' and 24b', has been stripped from the microelectronic fabrication.

Within the present invention and the preferred embodiments of the present invention, the blanket first etch stop/liner layer 14 may be patterned to form the pair of patterned first etch stop/liner layers 14a and 14b while employing etch methods, and in particular plasma etch methods, as are conventional in the art of microelectronic fabrication.

Similarly, the foregoing patterned photoresist layers may also be stripped from their respective microelectronic fabrications while employing photoresist stripping methods as are conventional in the art of microelectronic fabrication.

Finally, there is also shown within the schematic cross-sectional diagram of FIG. 6: (1) formed into the trench 40a contiguous with an extended via (formed from the second via 42, where the trench 40a and the extended via form a dual damascene aperture) and contacting the contact region 12 within the active product region R1 of the substrate 10, a contiguous patterned conductor interconnect and patterned conductor stud layer 32a; and (2) formed into the dummy trench 40b a dummy interconnect layer 32b.

Within the present invention, the contiguous patterned conductor interconnect and patterned conductor stud layer 32a and the dummy patterned conductor interconnect layer 32b may be formed employing methods as are conventional or unconventional in the art of microelectronic fabrication. Typically and preferably, they will be formed employing chemical mechanical polish (CMP) planarizing methods. Similarly, they may be formed of conductor materials as are conventional in the art of microelectronic fabrication, including but not limited to metal, metal alloy, doped polysilicon and polycide conductor materials, but particularly copper and copper alloy (greater than about 85 weight percent copper) conductor materials. Finally, they will generally include a conformal barrier layer first formed into the trench 40a contiguous with the extended via, or within the dummy trench 40b, such as to attenuate interdiffusion with adjoining layers.

Upon forming the microelectronic fabrication whose schematic cross-sectional diagram is illustrated in FIG. 6, there is formed a microelectronic fabrication in accord with the preferred embodiment of the present invention. The microelectronic fabrication has formed therein a uniform patterned conductor layer having formed interposed between its patterns a dielectric layer formed of an optimally low dielectric constant dielectric material layer construction.

The present invention realizes the foregoing object by employing for endpoint detection when forming a trench within a dual damascene aperture within an active product region of a microelectronic fabrication a dummy trench reaching and sensing an etch stop layer formed within a non active product region of the microelectronic fabrication and not the active product region of the microelectronic fabrication.

As is understood by a person skilled in the art, the preferred embodiments of the present invention are illustrative of the present invention rather than limiting of the present invention. Revisions and modifications may be made to methods, materials, structures and dimensions through which is provided a patterned conductor layer in accord with the preferred embodiments of the present invention, while still providing a dual damascene structure and a method for forming a dual damascene aperture in accord with the present invention, further in accord with the accompanying claims.

What is claimed is:

1. A method for forming a dual damascene aperture comprising:

providing a substrate having an active product region adjacent a non active product region;

forming over the substrate a first dielectric layer in turn having formed thereover a second dielectric layer;

forming over the substrate and interposed between the first dielectric layer and the second dielectric layer an etch stop layer formed in the non active product region, but not in the active product region;

forming through the second dielectric layer and the first dielectric layer in the active product region a dual damascene aperture comprising a trench contiguous with a via wherein the trench's width is greater than the via's width, wherein when forming the trench within the dual damascene aperture there is employed an etch method which forms a dummy trench within the non active product region, further where the dummy trench reaches the etch stop layer and the etch method is terminated upon sensing the etch stop layer for end point detection when forming the trench within the dual damascene aperture within the active product region.

2. The method of claim 1 further comprising forming into the dual damascene aperture a contiguous patterned conductor interconnect and patterned conductor stud layer.

3. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The method of claim 1 wherein each of the first dielectric layer and the second dielectric layer is formed of a comparatively low dielectric constant dielectric material selected from the group consisting of spin-on-glass (SOG) dielectric materials, spin-on-polymer (SOP) dielectric materials, nanoporous dielectric materials, amorphous carbon dielectric materials and fluorosilicate glass dielectric materials.

5. The method of claim 1 wherein each of the first dielectric layer and the second dielectric layer is formed to a thickness of from about 3000 to about 6000 angstroms.

6. The method of claim 1 wherein the patterned etch stop layer is formed to a thickness of from about 500 to about 1000 angstroms.

7. The method of claim 1 wherein the patterned etch stop layer is formed of an etch stop material selected from the group consisting of conductor etch stop materials and dielectric etch stop materials.

8. The method of claim 2 wherein the contiguous patterned conductor interconnect and patterned conductor stud layer is formed of a conductor material selected from the group consisting of copper and copper alloy conductor materials.

9. A method for forming a dual damascene aperture comprising:

providing a semiconductor substrate having an active product region adjacent a non active product region;

forming over the semiconductor substrate a first dielectric layer in turn having formed thereover a second dielectric layer;

forming over the semiconductor substrate and interposed between the first dielectric layer and the second dielectric layer an etch stop layer formed in the non active product region, but not in the active product region;

forming through the second dielectric layer and the first dielectric layer in the active product region a dual damascene aperture comprising a trench contiguous with a via wherein the trench's width is greater than the via's width, wherein when forming the trench within the dual damascene aperture there is employed an etch method which forms a dummy trench within the non active product region, further where the dummy trench reaches the etch stop layer and the etch method is terminated upon sensing the etch stop layer for end point detection when forming the trench within the dual damascene aperture within the active product region.

10. The method of claim 9 further comprising forming into the dual damascene aperture a contiguous patterned conductor interconnect and patterned conductor stud layer.

11. The method of claim 9 wherein each of the first dielectric layer and the second dielectric layer is formed of a comparatively low dielectric constant dielectric material selected from the group consisting of spin-on-glass (SOG) dielectric materials, spin-on-polymer (SOP) dielectric materials, nanoporous dielectric materials, amorphous carbon dielectric materials and fluorosilicate glass dielectric materials.

12. The method of claim 9 wherein each of the first dielectric layer and the second dielectric layer is formed to a thickness of from about 3000 to about 6000 angstroms.

13. The method of claim 9 wherein the patterned etch stop layer is formed to a thickness of from about 500 to about 1000 angstroms.

14. The method of claim 9 wherein the patterned etch stop layer is formed of a n etch stop material selected from the group consisting of conductor etch stop materials and dielectric etch stop materials.

15. The method of claim 10 wherein the contiguous patterned conductor interconnect and patterned conductor stud layer is formed of a conductor material selected from the group consisting of copper and copper alloy conductor materials.

* * * * *